United States Patent
Kim et al.

(10) Patent No.: US 7,711,918 B2
(45) Date of Patent: May 4, 2010

(54) APPARATUS AND METHOD FOR OPERATING FLASH MEMORY ACCORDING TO PRIORITY ORDER

(75) Inventors: Min-young Kim, Suwon-si (KR); Song-ho Yoon, Yongin-si (KR); Ji-hyun In, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 514 days.

(21) Appl. No.: 11/698,135

(22) Filed: Jan. 26, 2007

(65) Prior Publication Data
US 2007/0198768 A1    Aug. 23, 2007

(30) Foreign Application Priority Data
Feb. 22, 2006    (KR)    ....................... 10-2006-0017348

(51) Int. Cl.
*G06F 12/00*    (2006.01)
*G06F 13/18*    (2006.01)

(52) U.S. Cl. .................... 711/168; 711/103; 711/151

(58) Field of Classification Search ................ None
See application file for complete search history.

(56) References Cited

U.S. PATENT DOCUMENTS

| 7,093,064 B2* | 8/2006 | Dalvi et al. ................ 711/103 |
| 7,302,518 B2* | 11/2007 | Surico et al. ................ 711/103 |
| 7,340,542 B2* | 3/2008 | Moyer et al. ................ 710/39 |
| 2003/0070049 A1 | 4/2003 | Suzuki |
| 2004/0225850 A1 | 11/2004 | Li et al. |
| 2005/0078525 A1 | 4/2005 | Guo et al. |

FOREIGN PATENT DOCUMENTS

JP    10-177563 A    6/1998

* cited by examiner

*Primary Examiner*—Gary J Portka
(74) *Attorney, Agent, or Firm*—Sughrue Mion, PLLC

(57) ABSTRACT

Provided is an apparatus and method for operating a flash memory according to a priority order, in which a fast response is insured. The apparatus includes a time calculation unit which calculates an operation execution time required to perform a first operation, a remaining time calculation unit which calculates a remaining time until completion of the first operation based on the calculated operation execution time if a second operation having a higher priority than that of the first operation is requested during performing of the first operation, and an operation processing unit which compares the calculated remaining time with an operation suspension time requested to suspend the first operation and determines whether to suspend the first operation in accordance with a result of the comparison.

18 Claims, 5 Drawing Sheets

APPARATUS AND METHOD FOR OPERATING FLASH MEMORY ACCORDING TO PRIORITY ORDER

CROSS-REFERENCE TO RELATED APPLICATION

This application claims priority from Korean Patent Application No. 10-2006-0017348 filed on Feb. 22, 2006 in the Korean Intellectual Property Office, the disclosure of which is incorporated herein by reference in its entirety.

BACKGROUND OF THE INVENTION

1. Field of the Invention

Apparatuses and methods consistent with the present invention relate to operating a flash memory according to a priority order, and more particularly, to operating a flash memory according to a priority order, which ensures fast response time.

2. Description of the Related Art

Generally, embedded systems, such as electric home appliances, communication devices, and set top boxes, widely employ a nonvolatile memory as a storage medium that stores and processes data.

A flash memory, which is mainly used as the nonvolatile memory, is a memory device that can electrically erase or rewrite data. Such a flash memory is suitable for a portable device owing to its lower power consumption than a storage medium based on a magnetic disk memory, its fast access time equal to that of a hard disk, and its small size.

Also, the flash memory basically has write, read and erase operations and has hardware characteristics which require an erase operation of erasing a block before writing data. The erase operation of the flash memory takes long time when compared to a write operation and a read operation. Also, in case of operations of erasing several blocks simultaneously or reading/writing several pages at a time, the operations take longer time.

A real-time system which uses the flash memory has operations in various priority orders. If an operation having a high priority is requested, an operation having a low priority is suspended and the operation having a high priority is performed. If operations are requested to the system, the requested operations are arrayed according to priority order in an operation queue and are performed in the flash memory, by transferring information necessary for the flash order and execution to the flash memory through a flash translation layer before the operation in the operation queue is performed.

If, while an operation is in progress, an operation having a higher priority than the currently performed operation is requested, the flash memory usually operates the requested operation after finishing the currently performed operation.

At this time, in the system which uses a flash memory and requires a real-time response, even if an operation having a higher priority is requested during execution of a certain operation, since the operation having a higher priority is put on the standby until the current operation is completed, the system has a long response time.

Specifically, as shown in FIG. 1, when an operation having a high priority is requested during the execution of a certain operation, the requested operation is performed after being in a standby state until the currently performed operation is completed. However, it causes a delay of the response time in the real-time system.

Thus, in order to avoid the delay of the response time in the real-time system, if an operation having a high priority is requested while a certain operation is performed, the currently performed operation is suspended, and then is resumed and completed after the operation having a high priority is performed, thereby improving the response time. At this time, the operation suspension time for suspending the operation is required, and the operation resumption time for resuming the operation is also required.

However, as shown in FIG. 2, when an operation having a high priority is requested during the execution of a certain operation, if the currently performed operation is unconditionally suspended, the remaining time until completion of the currently performed operation is not considered. Thus, if the operation suspension time necessary for suspending the currently performed operation is more than the remaining time until completion of the currently performed operation, a problem occurs in that performing the operation having a high priority after the completion of the currently performed operation has a faster response time.

Also, if the currently performed operation is an erase operation, since the erase operation is suspended and then resumed after the execution of the operation having a high priority, a problem occurs in that the number of erase operations affecting the lifetime reduction of the flash memory is increased.

Japanese Patent Unexamined Publication No. 1998-177563 discloses a built-in microcomputer which stops providing the clock from a clock generation means to a CPU, according to signals output from a control circuit during a write period or an erase period to the flash memory.

However, this related art is to prevent the overload arisen from the frequent polling of the CPU on the completion of the write/erase operation of a flash memory while the write/erase operation of the flash memory is performed. That is, this related art fails to disclose a method of reducing the response time when an operation having a high priority is requested during the execution of a certain operation, in a real-time system which uses the flash memory.

SUMMARY OF THE INVENTION

The present invention provides an apparatus and method for operating a flash memory according to a priority order, in which, when an operation having a high priority is requested while a certain operation is already in progress, the response time of the operation having the high priority is reduced, by comparing the remaining time of the currently performed operation with the operation suspension time necessary for suspending the currently performed operation, and then selectively suspending the currently performed operation.

According to an aspect of the present invention, there is provided an apparatus for operating a flash memory according to a priority order, the apparatus including a time calculation unit which calculates an operation execution time required to perform a first operation, a remaining time calculation unit which calculates a remaining time until completion of the first operation based on the calculated operation execution time if a second operation having a higher priority than that of the first operation is requested during performing of the first operation, and an operation processing unit which compares the calculated remaining time with an operation suspension time required to suspend the first operation and determines whether to suspend the first operation in accordance with a result of the comparison.

According to another aspect of the present invention, there is provided a method of operating a flash memory according to a priority order, the method including calculating an operation execution time required to perform a first operation, calculating a remaining time until completion of the first operation based on the calculated operation execution time if a second operation having a higher priority than that of the first operation is requested during performing of the first operation, and comparing the calculated remaining time with an operation suspension time required to suspend the first operation and determining whether to suspend the first operation in accordance with a result of the comparing.

BRIEF DESCRIPTION OF THE DRAWINGS

The above and other aspects of the present invention will be more apparent from the following detailed description taken in conjunction with the accompanying drawings, in which.

DETAILED DESCRIPTION OF EXEMPLARY EMBODIMENTS OF THE INVENTION

Figure 1:
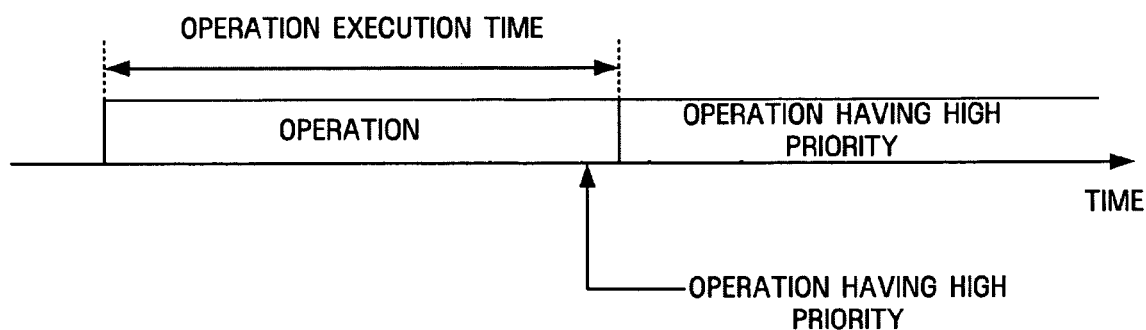
FIG. 1 is a view illustrating a flow of performing an operation having a high priority without suspending a currently performed operation according to the related art.
Figure 2:
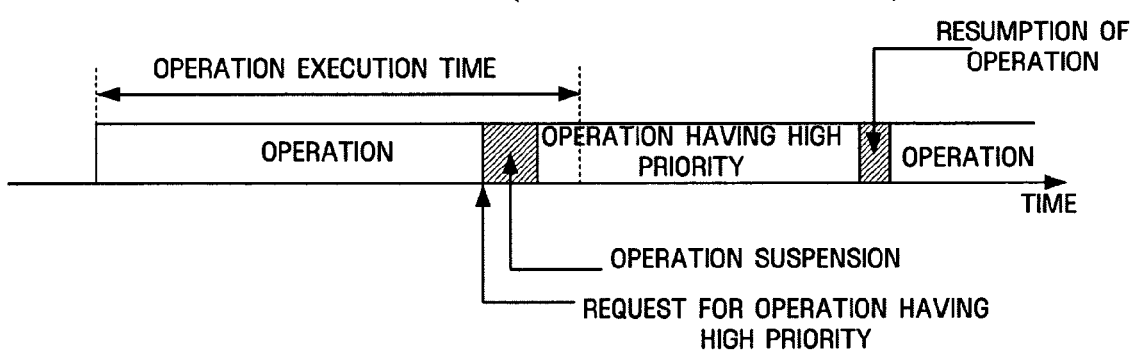
FIG. 2 is a view illustrating a flow of performing an operation having a high priority after suspending a currently performed operation according to the prior art.

Hereinafter, exemplary embodiments of the present invention will be described in detail with reference to the accompanying drawings. The aspects and features of the present invention and methods for achieving the aspects and features will be apparent by referring to the exemplary embodiments to be described in detail with reference to the accompanying drawings. However, the present invention is not limited to the exemplary embodiments disclosed hereinafter, but can be implemented in diverse forms. The matters defined in the description, such as the detailed construction and elements, are provided to assist those of ordinary skill in the art in a comprehensive understanding of the invention, and the present invention is only defined within the scope of the appended claims. In the entire description of the exemplary embodiments of the present invention, the same drawing reference numerals are used for the same elements across various figures.

The present invention will be described herein with reference to the accompanying drawings illustrating block diagrams and flowcharts for explaining an apparatus and method for operating a flash memory according to a priority order according to exemplary embodiments of the present invention. It will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which are executed via the processor of the computer or other programmable data processing apparatus, create means for implementing the functions specified in the flowchart block or blocks.

These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks.

The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions specified in the flowchart block or blocks.

Also, each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

Figure 3:
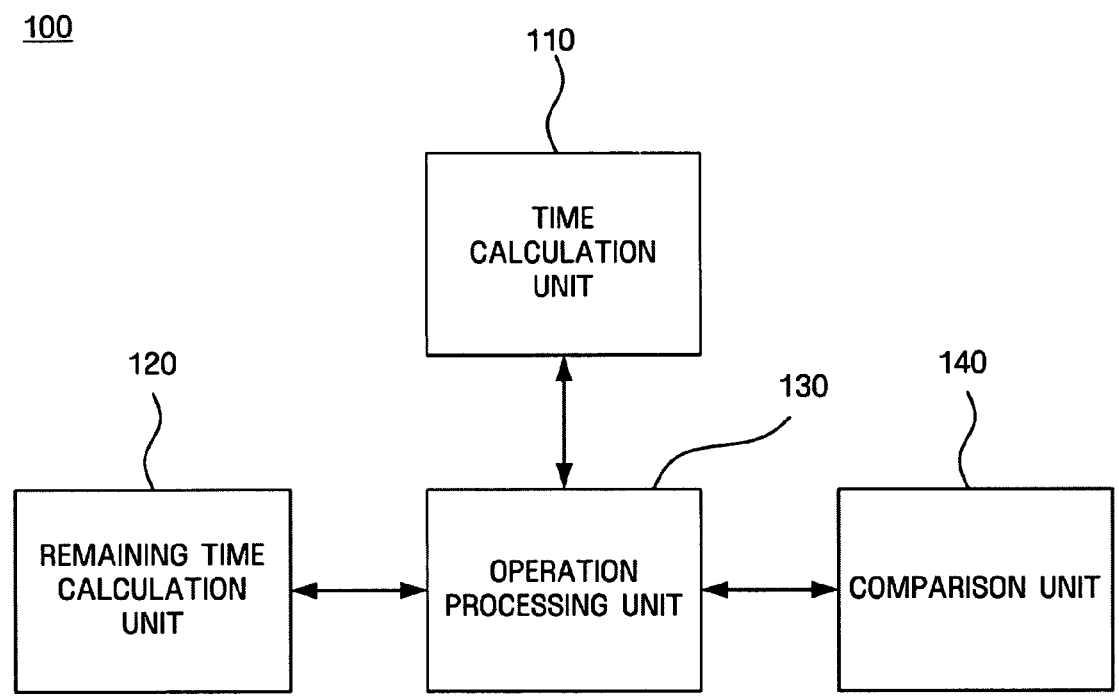
FIG. 3 is a block diagram illustrating the structure of an apparatus for operating a flash memory according to a priority order according to an exemplary embodiment of the present invention.

FIG. 3 is a block diagram illustrating the structure of an apparatus for operating a flash memory according to a priority order according to an exemplary embodiment of the present invention.

As shown in FIG. 3, the apparatus 100 for operating a flash memory according to a priority order according to an exemplary embodiment of the present invention includes a time calculation unit 1 10, a remaining time calculation unit 120, an operation processing unit 130 and a comparison unit 140.

The time calculation unit 110 calculates an operation execution time required to perform a read, write, or erase operation. The operation execution time varies depending on the operation type and the operation amount.

Also, the time calculation unit 110 calculates an operation suspension time required to suspend the ongoing operation and an operation resumption time required to resume the suspended operation as well as the operation execution time. At this time, the operation suspension time and the operation resumption time vary depending on the type of the operation.

The remaining time calculation unit 120 calculates a remaining time until completion of the first operation, when a second operation having a higher priority than that of the first operation is requested during the execution of the first operation in the flash memory In an exemplary embodiment of the present invention, the operation requested in the flash memory is arrayed in an orderly manner according to the priority order and stored in an operation queue, and the flash memory performs the operation according to the stored order. At this time, the first operation and the second operation may be understood as, but are not limited to, write operation, read operation, and erase operation in the flash memory.

The remaining time calculation unit 120 calculates the remaining time until completion of the first operation, through the operation execution time calculated by the time calculation unit 110 and the time elapsed since the first operation was initially performed.

Specifically, the operation processing unit 130, to be described later, continuously detects the elapsed time of the ongoing operation since the first operation was initially performed. The remaining time calculation unit 120 calculates the remaining time until completion of the first operation through the time difference between the elapsed time detected by the operation processing unit 130 and the operation execution time calculated by the time calculation unit 110.

In the exemplary embodiment of the present invention, the operation processing unit 130 for detecting the elapsed time of the ongoing operation is described. However, the present invention is not limited to this example. That is, the elapsed time may be detected by an additional timer for detecting the elapsed time of the ongoing operation.

The operation processing unit 130 determines whether to suspend the first operation through the remaining time calculated by the remaining time calculation unit 120 and the operation suspension time required to suspend the first operation. The comparison unit 140 compares the remaining time with the operation suspension time and transfers the comparison result to the operation processing unit 130. Meanwhile, the operation processing unit 130 continuously detects the elapsed time of the operation while a certain operation is performed. At this time, the detected elapsed time is used to calculate the remaining time until completion of the certain operation.

Specifically, the operation processing unit 130 receives the result of the comparison between the remaining time of the first operation and the operation suspension time of the first operation, and determines whether to suspend the first operation based on the received comparison result. More Specifically, the operation suspension time of the first operation is calculated by the aforementioned time calculation unit I 0, and the operation processing unit 130 determines whether to suspend the first operation or not based on the result of comparison between the calculated operation suspension time and the remaining time of the first operation calculated by the remaining time calculation unit 120. At this time, the comparison result is transferred from the comparison unit 140 to the operation processing unit 130.

For example, if the remaining time calculated by the remaining time calculation unit 120 is greater than the operation suspension time, the operation processing unit 130 suspends the first operation and then performs the second operation having a higher priority than that of the first operation. On the other hand, if the calculated remaining time is less than or the same as the operation suspension time, the operation processing unit 130 does not suspend the first operation but puts the second operation in a standby state and performs the second operation when the first operation is completed.

In a system which uses a flash memory and requires a real-time response, if an operation having a higher priority than that of the already ongoing operation is requested, the flash memory suspends the ongoing operation and performs the operation having a higher priority, or performs the operation having a higher priority after completing the already ongoing operation. At this time, the real-time system requires a faster response. Thus, if the remaining time is greater than the operation suspension time, the ongoing operation is suspended and the operation having a high priority is performed in advance. However, if the remaining time is less than or the same as the operation suspension time, since the completion of the ongoing operation takes the same time as or less time than the operation suspension time, the ongoing operation is completed and then the operation having a high priority is performed. Thus, the fast response is ensured in the real-time system.

In a case that the first operation is an erase operation which takes a long time compared to other operations such as a read or write operation, if the first operation is unconditionally suspended and the second operation having a high priority is performed when the second operation having a high priority is requested, the lifetime of the flash memory is reduced due to the increase in the number of erase operations subject to suspension and subsequent resumption.

Thus, the exemplary embodiment of present invention makes it possible to reduce the response time and prevent the lifetime reduction of the flash memory by selectively suspending the first operation through the comparison between the remaining time until completion of the first operation and the operation suspension time necessary for suspending the first operation.

Figure 4:
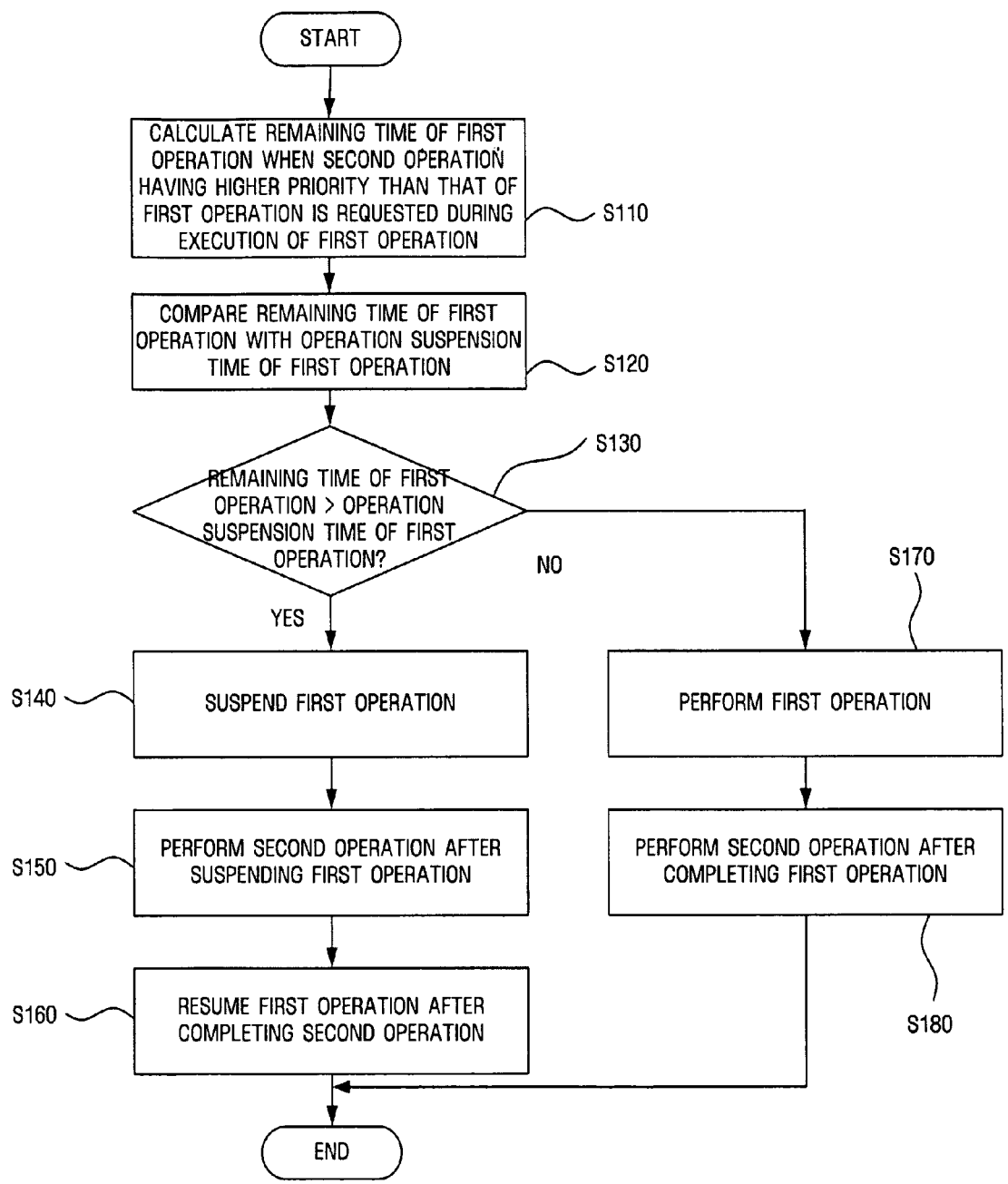
FIG. 4 is a flowchart illustrating a method of operating a flash memory according to a priority order according to an exemplary embodiment of the present invention.

FIG. 4 is a flowchart illustrating a method of operating a flash memory according to a priority order according to an exemplary embodiment of the present invention.

Now, the method of operating a flash memory according to a priority order according to an exemplary embodiment of the present invention will be described.

First, when the second operation having a higher priority than that of the first operation is requested during the execution of the first operation, the remaining time calculation unit 120 calculates the remaining time until completion of the first operation (S110). At this time, the remaining time calculation 120 calculates the remaining time of the first operation through time difference between the operation execution time calculated by the time calculation unit 110 and the elapsed time detected by the operation processing unit 130.

Figure 5:
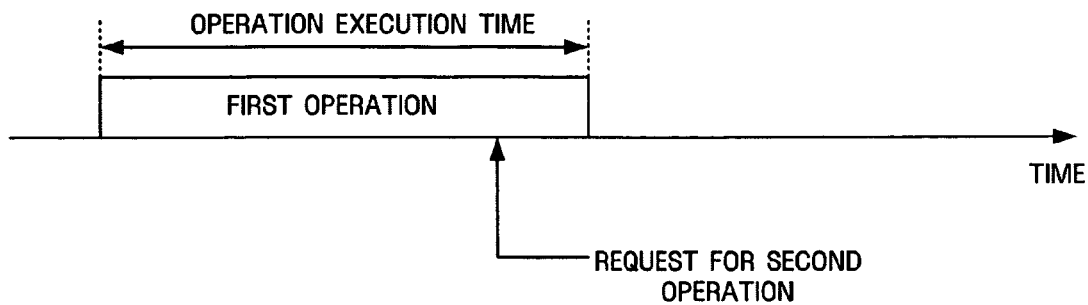
FIG. 5 is a view illustrating a second operation requested while a first operation is performed, according to an exemplary embodiment of the present invention.

Specifically, as shown in FIG. 5, the second operation having a higher priority than that of the first operation is requested while the first operation is in progress and is not finished, the remaining time calculation unit 120 calculates the remaining time until completion of the first operation through time difference between the operation execution time of the first operation calculated by the time calculation unit 110 and the elapsed time of the first operation detected by the operation processing unit 130.

The comparison unit 140 compares the remaining time of the first operation calculated by the remaining time calculation unit 120 with the operation suspension time necessary for suspending the first operation (S120). In other words, as shown in FIG. 6, when the second operation having a higher priority than that of the first operation is requested before the first operation is completed, the comparison unit 140 compares the remaining time until completion of the first operation from the current point of time with the operation suspension time necessary for suspending the first operation.

Figure 6:
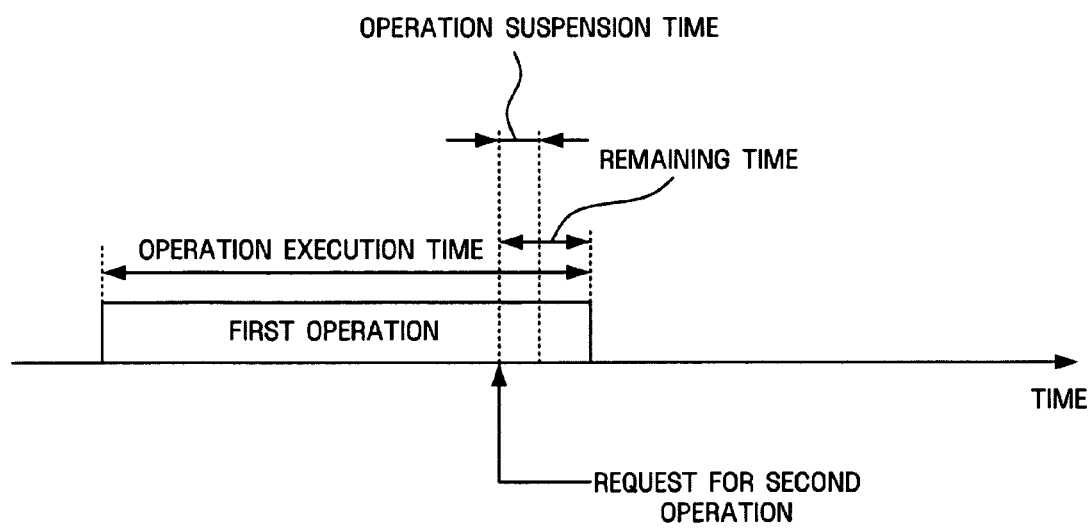
FIG. 6 is a view illustrating a remaining time and an operation suspension time according to an exemplary embodiment of the present invention.

If the comparison result is, as shown in FIG. 6, that the remaining time of the first operation is greater than the operation suspension time (S130), the operation processing unit 130 suspends the ongoing first operation (S140), and then performs the second the operation (S150).

Also, when the second operation is completed, the operation processing unit 130 resumes the first operation suspended in step S140, after the operation resumption time of the first operation is elapsed (S160).

If the comparison result is that the remaining time of the first operation is less than or the same as the operation suspension time (S130), the operation processing unit 130 completes the first operation (S170), and then performs the second operation (S180).

As described above, in the method of operating a flash memory according to a priority order according to an exemplary embodiment of the present invention, since whether to suspend the first operation is determined through the comparison between the remaining time of the first operation and the operation suspension time of the first operation, when the second operation having a higher priority than that of the first operation is requested, it is possible to expect a fast response speed in the real-time system and prevent the lifetime reduction of the flash memory arisen from the increase in the number of erase operations, which take a long execution time compared to read/write operations, subject to suspension and subsequent resumption.

Figure 7:
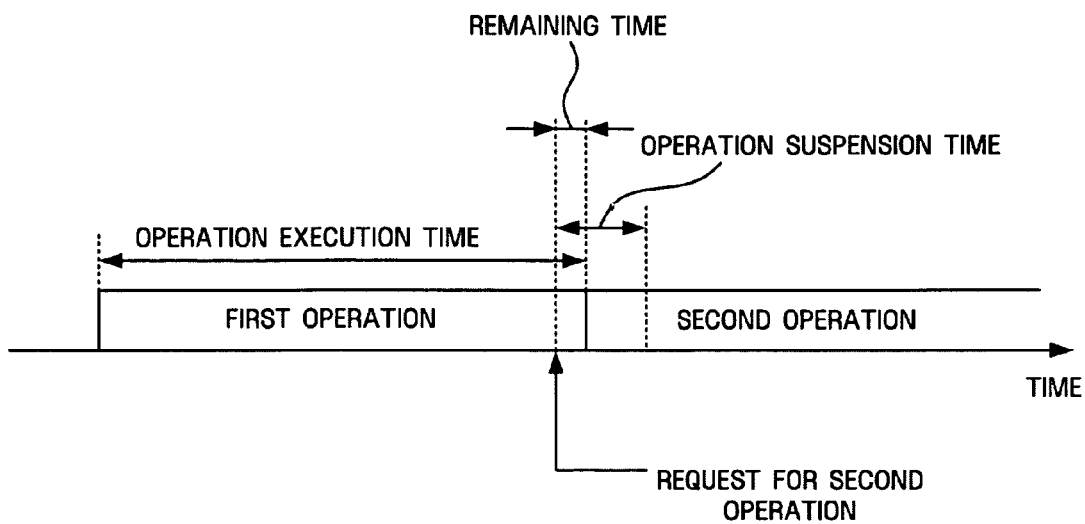
FIG. 7 is a view illustrating a flow of performing the second operation without suspending the first operation according to an exemplary embodiment of the present invention.

FIG. 7 is a view illustrating a flow of performing the second operation without suspending the first operation according to an exemplary embodiment of the present invention.

As shown in FIG. 7, if the second operation having a higher priority than that of the first operation is requested while the first operation is performed, the remaining time calculation unit 120 calculates the remaining time until completion of the first operation. At this time, the remaining time may be calculated through the time difference between the operation execution time of the first operation calculated by the time calculation unit 110 and the elapsed time of the first operation detected by the operation processing unit 130. The comparison unit 140 compares the remaining time of the first operation calculated by the remaining time calculation unit 120 with the operation suspension time of the first operation.

At this time, the comparison between the remaining time of the first operation and the operation suspension time of the first operation is intended to ensure a fast response-for the second operation having a higher priority than that of the first operation, since, if the remaining time of the first operation is less than or the same as the operation suspension time of the first operation, the fast response is ensured when the second operation is performed after the completion of the first operation.

Therefore, the operation processing unit 130 performs the second operation after completing the first operation. Thus, since the first operation is not unconditionally suspended when the second operation having a higher priority than that of the first operation is requested, in case that the first operation is an erase operation which takes a long time compared to a write/read operation, the lifetime reduction of the flash memory arisen from the increase in the number of erase operations, which is subject to suspension and subsequent resumption of the first operation, can be prevented.

Figure 8:
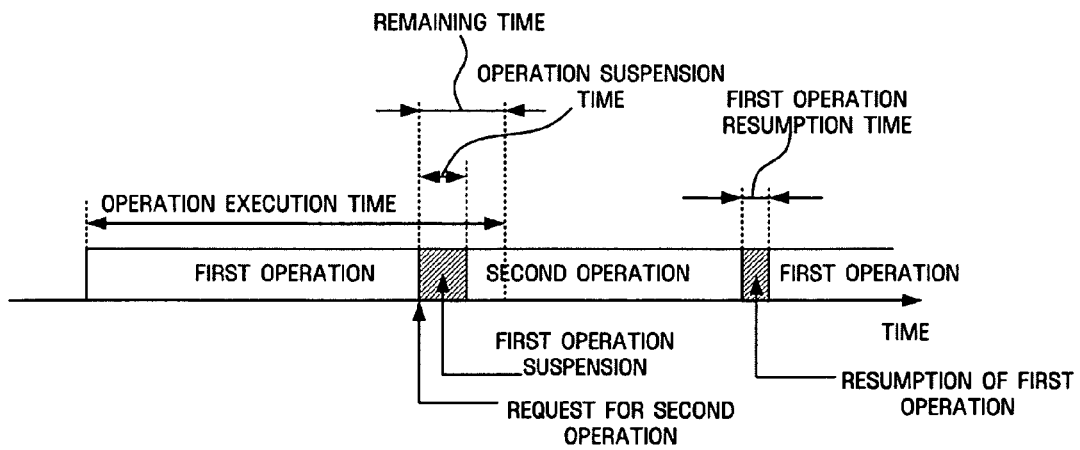
FIG. 8 is a view illustrating a flow of performing the second operation after suspending the first operation according to an exemplary embodiment of the present invention.

FIG. 8 is a view illustrating a flow of performing the second operation after suspending the first operation according to an exemplary embodiment of the present invention.

As shown in FIG. 8, if the second operation having a higher priority than that of the first operation is requested when the first operation is in progress, the remaining time calculation unit 120 calculates remaining time until completion of the first operation. At this time, the remaining time may be calculated through time difference between the execution time of the first operation calculated by the time calculation unit 110 and the elapsed time of the first operation detected by the operation processing unit 130. The comparison unit 140 compares the remaining time of the first operation calculated by the remaining time calculation unit 120 with the operation suspension time of the first operation.

At this time, the comparison between the remaining time of the first operation and the operation suspension time of the first operation is intended to ensure a fast response for the second operation having a higher priority than that of the first operation, since, if the remaining time of the first operation is greater than the operation suspension time of the first operation, the fast response is ensured when the first operation is suspended and then the second operation is performed in advance.

Therefore, the operation processing unit 130 suspends the first operation, and then performs the second operation after the operation suspension time of the first operation is elapsed. Also, when the second operation is completed, the operation processing unit 130 resumes the first operation after the operation resumption time necessary for resuming the first operation is elapsed.

In the apparatus and method for operating a flash memory according to a priority order according to exemplary embodiments of the present invention, the term "unit", as used herein, means, but is not limited to, a software or hardware component, such as a Field Programmable Gate Array (FPGA) or Application Specific Integrated Circuit (ASIC), which performs certain tasks. A unit may advantageously be configured to reside on the addressable storage medium and configured to execute on one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units, may be combined into fewer components and units or further separated into additional components and units.

As described above, in the apparatus and method for operating a flash memory according to a priority order according to exemplary embodiments of the present invention, when the operation having a higher priority than that of the already ongoing operation is requested during the execution of the ongoing operation, the remaining time until completion of the ongoing operation is compared with the operation suspension time necessary for suspending the ongoing operation and then the ongoing operation is selectively suspended, whereby the response time of the operation having a high priority can be reduced, and the lifetime reduction of the flash memory caused by the increase of erase operations subject to suspension and subsequent resumption can be avoided, in case that the currently performed operation is the erase operation.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An apparatus for operating a flash memory according to a priority order, the apparatus comprising:
   a time calculation unit which calculates an operation execution time required to perform a first operation;
   a remaining time calculation unit which calculates a remaining time until completion of the first operation based on the calculated operation execution time, if a second operation having a higher priority than that of the first operation is requested during performing of the first operation; and
   an operation processing unit which compares the calculated remaining time with an operation suspension time required to suspend the first operation, and determines whether to suspend the first operation in accordance with a result of the comparison.

2. The apparatus of claim 1, wherein the operation processing unit suspends the first operation, if the remaining time is greater than the operation suspension time.

3. The apparatus of claim 2, wherein the operation processing unit performs the second operation after suspending the first operation.

4. The apparatus of claim 3, wherein the operation processing unit resumes the first operation after completing the execution of the second operation.

5. The apparatus of claim 1, wherein the operation processing unit puts the second operation in a standby state until the first operation is completed, if the operation suspension time is greater than the remaining time.

6. The apparatus of claim 1, further comprising a comparison unit which transfers the result of comparison between the remaining time and the operation suspension time to the operation processing unit.

7. A method of operating a flash memory according to a priority order, the method comprising:
    calculating an operation execution time required to perform a first operation;
    calculating a remaining time until completion of the first operation based on the calculated operation execution time, if a second operation having a higher priority than that of the first operation is requested during performing of the first operation; and
    comparing the calculated remaining time with an operation suspension time required to suspend the first operation, and determining whether to suspend the first operation in accordance with a result of the comparing.

8. The method of claim 7, wherein the determining comprises suspending the first operation, if the remaining time is greater than the operation suspension time.

9. The method of claim 8, wherein the determining further comprises performing the second operation after suspending the first operation.

10. The method of claim 9, wherein the determining further comprises resuming the first operation after completing the execution of the second operation.

11. The method of claim 7, wherein the determining comprises putting the second operation in a standby state until the first operation is completed, if the operation suspension time is greater than the remaining time.

12. A computer readable recording medium storing a computer program for performing a method of operating a flash memory according to a priority order, the method comprising:
    calculating an operation execution time required to perform a first operation;
    calculating a remaining time until completion of the first operation based on the calculated operation execution time, if a second operation having a higher priority than that of the first operation is requested during performing of the first operation; and
    comparing the calculated remaining time with an operation suspension time required to suspend the first operation, and determining whether to suspend the first operation in accordance with a result of the comparing.

13. The apparatus of claim 1, wherein requested operations are arrayed in an orderly manner according to a priority order and stored in an operation queue of the flash memory, the requested operations being performed by the flash memory according to the stored order of the requested operations.

14. The apparatus of claim 1, wherein the operation processing unit continuously detects an elapsed time of the first operation while the first operation is performed, and the remaining time calculation unit calculates the remaining time until completion of the first operation based on the detected elapsed time of the first operation.

15. The apparatus of claim 4, wherein the first operation is resumed after a further elapsing of an operation resumption time.

16. The method of claim 7, wherein requested operations are arrayed in an orderly manner according to a priority order and stored in an operation queue of the flash memory, the requested operations being performed by the flash memory according to the stored order of the requested operations.

17. The method of claim 7, wherein an elapsed time of the first operation is continuously detected while the first operation is performed, and the remaining time until completion of the first operation is calculated based on the detected elapsed time of the first operation.

18. The method of claim 10, wherein the first operation is resumed after a further elapsing of an operation resumption time.

* * * * *